(12) United States Patent
Allen et al.

(10) Patent No.: US 8,283,190 B2
(45) Date of Patent: Oct. 9, 2012

(54) LED LAMP WITH REMOTE PHOSPHOR COATING AND METHOD OF MAKING THE LAMP

(75) Inventors: Steven C. Allen, Beverly, MA (US); Richard S. Speer, Concord, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 25 days.

(21) Appl. No.: 12/999,651

(22) PCT Filed: Jun. 24, 2009

(86) PCT No.: PCT/US2009/048492
§ 371 (c)(1),
(2), (4) Date: Dec. 17, 2010

(87) PCT Pub. No.: WO2009/158422
PCT Pub. Date: Dec. 30, 2009

(65) Prior Publication Data
US 2011/0133222 A1 Jun. 9, 2011

Related U.S. Application Data

(60) Provisional application No. 61/075,866, filed on Jun. 26, 2008.

(51) Int. Cl.
*H01L 33/50* (2010.01)
*H01L 33/64* (2010.01)

(52) U.S. Cl. ........ 438/27; 257/98; 257/E33.06; 257/E33.075; 257/88

(58) Field of Classification Search ............... 257/88, 257/98–101, E33.06, E33.075, E21.001
See application file for complete search history.

(56) References Cited

U.S. PATENT DOCUMENTS

| 6,635,363 | B1 | 10/2003 | Duclos |
| 2004/0207998 | A1 | 10/2004 | Suehiro |
| 2006/0022582 | A1 | 2/2006 | Radkov |

(Continued)

FOREIGN PATENT DOCUMENTS

WO 2004/021461 A 3/2004

(Continued)

OTHER PUBLICATIONS

Katie Allen, International Search Report for PCT/US09/48492, mailed Sep. 1, 2009, pp. 1-3, European Patent Office, Rijswijk, The Netherlands.

*Primary Examiner* — Benjamin Sandvik
*Assistant Examiner* — Whitney T Moore
(74) *Attorney, Agent, or Firm* — Shaun P. Montana

(57) ABSTRACT

A light emitting diode (LED) lamp includes a base with one or more LED chips, an internal cover over the LED chips, where the cover is a translucent ceramic whose thermal conductivity is greater than glass, where the cover has an interior surface separated from the LED chips by a gap, and where an exterior surface of the cover is coated with a phosphor. The ceramic cover preferably has a bulk thermal conductivity of at least 5 W/(m·K), such as polycrystalline alumina. The LED chips preferably are blue LEDs and the phosphor is selected so that the lamp emits white light. In the method of making the lamp, the phosphor may be applied to the exterior surface of the cover as a preformed sheet or in a coating.

8 Claims, 4 Drawing Sheets

U.S. PATENT DOCUMENTS

| | | |
|---|---|---|
| 2006/0258028 A1 | 11/2006 | Paolini et al. |
| 2007/0058357 A1 | 3/2007 | Yamaguchi et al. |
| 2008/0054280 A1 | 3/2008 | Reginelli |
| 2008/0187746 A1* | 8/2008 | De Graaf et al. ............. 428/332 |

FOREIGN PATENT DOCUMENTS

| | | |
|---|---|---|
| WO | 2005/078338 A | 8/2005 |
| WO | 2006/097876 A | 9/2006 |
| WO | 2007/075393 A | 7/2007 |

* cited by examiner

Figure 1 (Prior Art)
Figure 2 (Prior Art)
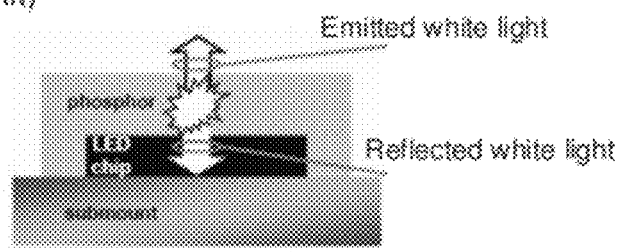
Figure 3
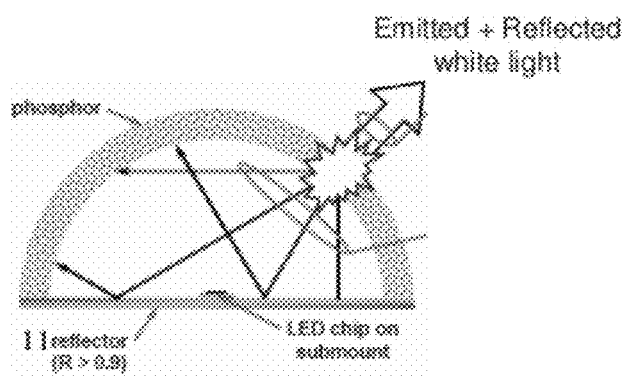

LED chips 14

LED LAMP WITH REMOTE PHOSPHOR COATING AND METHOD OF MAKING THE LAMP

CROSS-REFERENCE TO RELATED APPLICATION(S)

The present application claims priority of PCT Application Serial No. PCT/US09/48492, filed on Jun. 23, 2009, of which this current application is the U.S. National Stage application, and U.S. Provisional Patent Application Ser. No. 61/075,866, filed on Jun. 26, 2008, entitled "Highly Efficient Small Form Factor LED Retrofit Lamp", the entire contents of both of which are hereby incorporated by reference.

TECHNICAL FIELD

The present invention is directed to a light emitting diode (LED) lamp and a method of making the lamp.

BACKGROUND

Solid state lighting technology is beginning to penetrate the white lighting market due to recent gains in LED device and luminaire efficacy. LED solutions can be found in applications where LEDs can be distributed to ease the difficulty of thermal management, such as linear strips and down-lighting solutions where the luminaire is relatively large. Development of small form factor LED retrofits with high luminous flux has been challenging because of the limited volume for driver electronics and surface area for heat dissipation.

Conventional 50 W Sylvania MR16 halogen reflector lamps, such as shown in FIG. 1, are small form factor lamps primarily used in interior retail and residential applications. Dimensions of the MR16 are no more than about 2.0 inches in diameter and 1.9 inches in overall length. A 50 W halogen achieves about 600 lumens. Beam angle varies by application, ranging from less than 10° narrow spot lights to about 60° wide flood lights. Color quality is important in retail applications as the light output from the lamps must render merchandise in a very high quality.

Typically, the most efficacious high CRI warm white approach is to mix white phosphor converted InGaN LEDs with red InGaAlP LEDs. Since the two materials have different thermal characteristics, a complex and costly sensing and feedback control mechanism is needed to stabilize the white color point. This technique is not suitable for the small MR16 lamp; there simply is not sufficient space to house both LED drivers and control systems and such a replacement lamp may not have sufficient heat sinking area to maintain low InGaAlP junction temperatures required for this technique.

SUMMARY

An object of the present invention is to provide a novel LED lamp suitable for small form factor retrofit that solves the problems of the prior art, and to a method of making this lamp.

A further object of the present invention is to provide a novel LED lamp that includes a base with one or more LED chips, an internal cover over the LED chips, where the cover is a translucent ceramic, where the cover has an interior surface separated from the LED chips by a gap, and where an exterior surface of the cover is coated with a phosphor. The ceramic cover preferably has a bulk thermal conductivity of at least 5 W/(m·K), such as polycrystalline alumina. The LED chips preferably are blue LEDs and the phosphor is selected so that the lamp emits white light.

A yet further object of the present invention is to provide a novel method of making this lamp.

These and other objects and advantages of the invention will be apparent to those of skill in the art of the present invention after consideration of the following drawings and description of preferred embodiments.

BRIEF DESCRIPTION OF THE DRAWINGS

FIG. 1 is an example of a prior art lamp.
FIG. 2 shows prior art chip-level conversion of light emitted from an LED.
FIG. 3 shows remote phosphor conversion of light emitted from an LED as in the present invention.

DETAILED DESCRIPTION

At the core of any LED retrofit lamp is the light engine. Conventional white LED light engines, such as the one shown in FIG. 2, contain a blue-emitting LED chip with a phosphor coating in direct contact with the LED chip, which is referred to herein as chip-level conversion (CLC). Embodiments of the present invention, such as shown in FIG. 3, are alternatives to CLC and may be referred to as remote phosphor (RP) conversion. In RP conversion the phosphor is moved out of contact with the surface of the LED chip. That is, the interior surface of the substrate carrying the phosphor is separated from the LED chip by a gap. The heat generated by the phosphors due to the Stokes shift is conducted away by the substrate, where the substrate has a thermal conductivity that is significantly better than glass ("glass" being a substantially transparent amorphous material comprised mostly of, but not limited to, silica, lead oxide, or titanium oxide and having a thermal conductivity of about 1 W/(m·K)). The substrate is preferably a ceramic such as polycrystalline alumina or polycrystalline aluminum oxide (each referred to as PCA herein).

Figure 4:
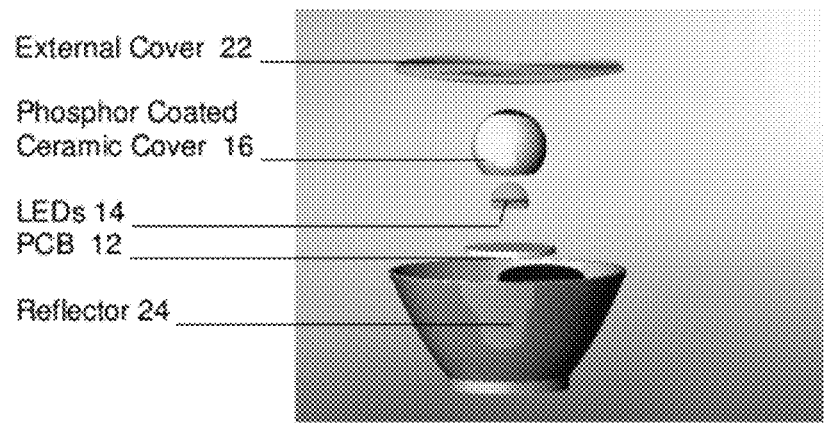
FIG. 4 is an exploded view of an embodiment of the present invention.

As illustrated in the exploded view of the present invention in FIG. 4, a light emitting diode (LED) lamp of the present invention includes a base 12 (such as a printed circuit board) with one or more LED chips 14 operably mounted thereon, and an internal cover 16 attached to the base over the LED chips, the cover 16 being an at least translucent ceramic whose thermal conductivity is greater than glass, where an interior surface of the cover 16 is separated from the LED chips by a gap and where a phosphor coats an exterior surface of the cover. The phosphor converts light of a first wavelength range emitted by the LED chips 14 to light of a different wavelength range emitted by the lamp.

Figure 5:
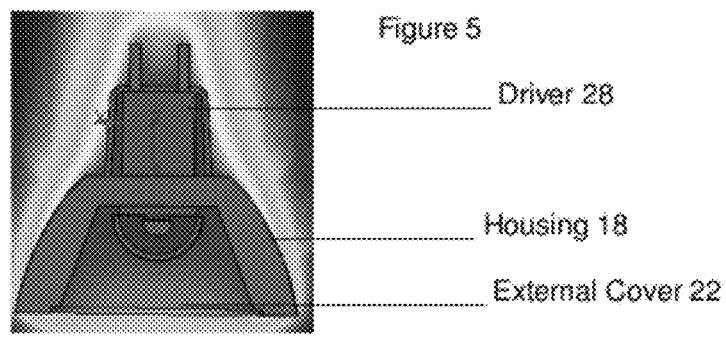
FIG. 5 is a cut-away view of an embodiment of the present invention.
Figure 6:
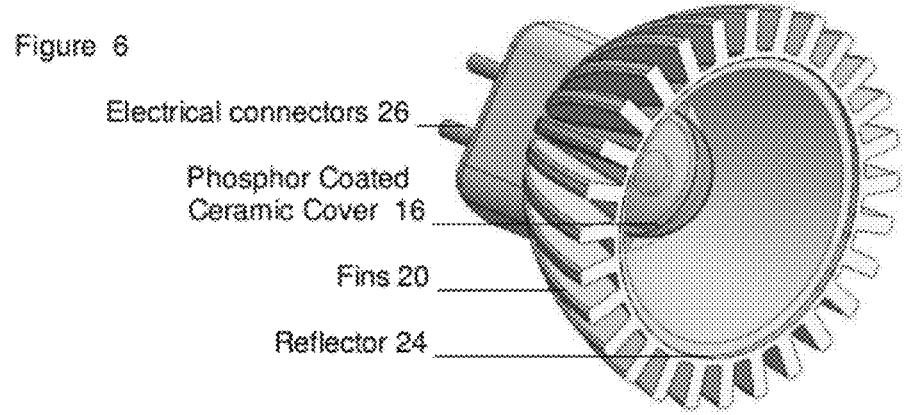
FIG. 6 is a pictorial representation of an embodiment of the present invention.

With reference also to FIGS. 5 and 6, embodiments of the present invention may also include a housing 18 having heat-radiating fins 20, an external cover 22, a reflector 24, and suitable electrical connections 26 for the lamp. The base and fins may be made of a material with high heat conductivity, such as aluminum, and the external cover 22 and reflector 24 (mounted in the housing 18 to redirect light emitted by the phosphor-coated ceramic cover 16) may be selected depending on the beam to be emitted by the lamp. The base 12 may include a light reflective surface covering the base under the cover, such as the reflective surface 11 on the base 12 around the LED chip 14 in FIG. 3. A driver 28 may be mounted in the housing 18.

The external cover 22 need not be present in all embodiments and may be transparent or translucent, depending on the application. In some embodiments, the external cover may be a lens. The external cover may include a protective element.

Figure 7:
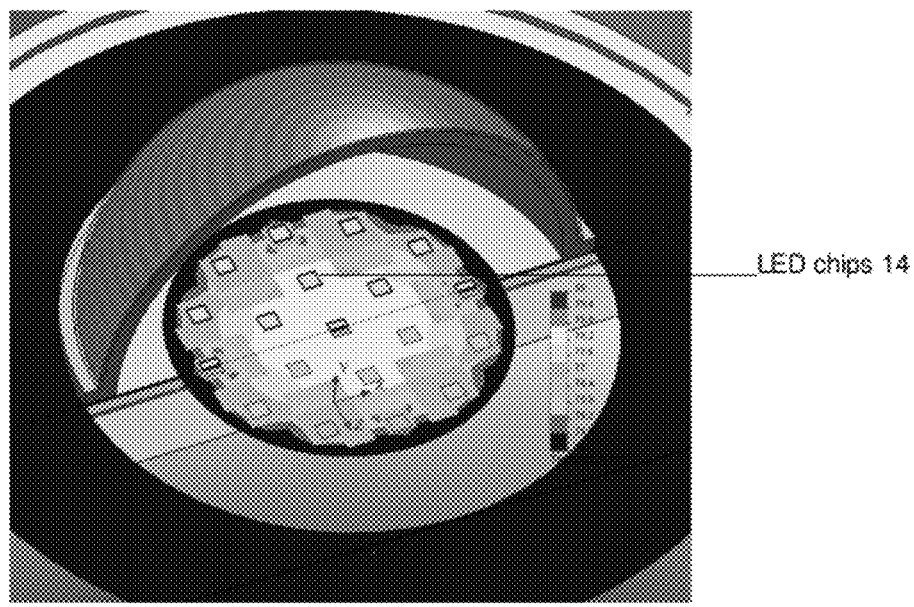
FIG. 7 is a partial cut-away view of a further embodiment of the present invention.

Plural LED chips 14 may be arranged on the base 12 in a manner that takes into account the heat they generate. For example, as shown in FIG. 7, the plural chips 14 may be spaced about 4-6 mm apart on the base 12.

Figure 8:
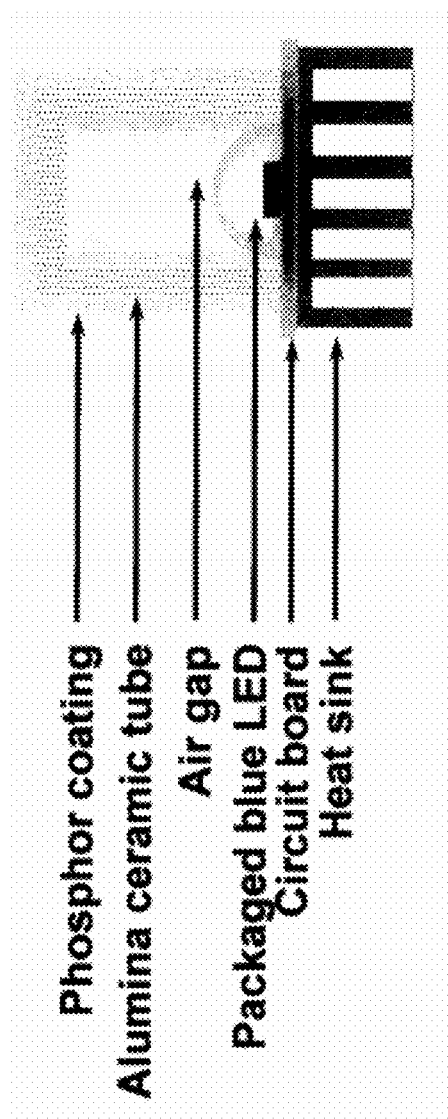
FIG. 8 is a schematic illustration of yet a further embodiment of the present invention.

In some embodiments, the internal cover 16 may be dome-shaped and thus hollow, as shown in FIG. 3, or may be tubular as shown, by way of example, in FIG. 8. Embodiments may include a single light engine, for example when the lamp is to emulate a candle, or multiple light engines spaced along the length of the tube when the lamp is to emit light in a manner similar to a tubular fluorescent lamp. Other shapes, such as flat plates, may also be employed, depending on the application. The internal cover 16 preferably is made of PCA, which is a conventional translucent ceramic used for sodium vapor and metal halide lamps. PCA is relatively inexpensive and can be sintered to a high visible light transmittance. While the internal cover 16 needs to have a thermal conductivity greater than glass, the preferred minimum thermal conductivity for the PCA cover is 28 W/(m·K). Other ceramics with bulk thermal conductivity greater than glass (desirably having a bulk thermal conductivity of at least 5 W/(m·K)) may also be used, such as polycrystalline and single crystal alumina, aluminum nitride, and aluminum oxynitride. In some embodiments, the gap between the LED chips 14 and the interior surface of the cover 16 may be filled with air or another suitable gas, or filled with epoxy or a silicone encapsulation for the LED chips.

Embodiments of the present invention preferably use thermally robust InGaN blue LEDs that offer a simpler and more cost efficient solution while achieving excellent color rendering by optimizing the phosphor blend and blue LED wavelength. Further, RP conversion technology has both efficacy and thermal management benefits over CLC. Remote phosphor blue to white color conversion has a 20% higher optical efficiency than CLC. The thermal conductivity of the ceramic phosphor substrate (e.g., the PCA) allows the remote phosphor size to be kept small, even for high excitation intensities, a requirement for small form factor, high flux lamps. The resulting reduction in heat load and use of a thermally conductive phosphor substrate can significantly reduce LED junction and phosphor temperatures compared to CLC. The embodiments described herein offer an ideal solution for small form factor high performance warm white lamps, such as an MR16 replacement.

RP conversion technology offers advantages over CLC technology at least in part due to higher potential optical and thermal efficiencies. For CLC, the phosphor emits and reflects significant light back into the chip, so optical conversion efficiency ($\eta_{OC}$) is limited by the chip reflectivity. For a properly designed RP configuration, light reflected and back-emitted from the phosphor can be extracted with higher efficiency than CLC. Optical conversion efficiencies up to 0.99 have been found for a white RP LED, while a prototype embodiment using commercially available blue LED packages, a circuit board with a high reflectivity conformal coating, and a 2 cm diameter PCA bulb with an external silicone/yttrium aluminum garnet (YAG):Ce phosphor coating had an $\eta_{OC}$ that averaged 90% for CCTs ~5800 K, after accounting for Stokes conversion losses. This is a significant improvement over the current state of the art CLC technology.

Estimates of the instant-on efficacy and flux of embodiments indicate a 20% increase in such values for the RP conversion compared to CLC. In addition, because of the increased optical efficiency, 17% less heat will be dissipated, which can result in increased thermal efficiency as well.

Using four high power (1 mm$^2$) chips; peak wavelength ~460 nm; drive voltage 3.2 V for 350 mA current, Stokes efficiency=77%, spectrum optical efficiency=300 lm/W, and the phosphor conversion efficiency above we can compute the light engine flux and efficacies as shown in the table below.

TABLE 1

Projected light engine flux and efficacy values at 25° C.

| Technology | Current (mA) | Blue LED WPE | $T_{LED}$ (°C.) | $T_{Phosphor}$ (°C.) | Flux (lm) | Efficacy (lm/W) |
|---|---|---|---|---|---|---|
| CLC | 350 | 60% | 25 | 25 | 466 | 104 |
| RP on PCA | 350 | 60% | 25 | 25 | 559 | 125 |
| CLC | 350 | 70% | 25 | 25 | 543 | 121 |
| RP on PCA | 350 | 70% | 25 | 25 | 652 | 146 |

The efficiency of blue LEDs has been steadily increasing for several years, resulting in high power blue chips capable of efficiencies greater than 50% at 350 mA today. Osram Opto Semiconductors has reported values up to 643 mW of output power at 350 mA for a wall plug efficiency (WPE) exceeding 50%, as may be seen http://www3.interscience.wiley.com/journal/121660909/abstract.

As a typical MR16-sized bulb leaves little room to create a heat sink with a large surface area, thermal management solutions must be unique to solve this challenge. Embodiments described herein offer advantages for thermal management; they use blue LEDs which have inherently less flux decay with rising temperature, and a remote phosphor which is deposited on PCA, a dense ceramic that provides heat conduction from the phosphor which heats up due to the Stokes shift and quantum conversion loss.

Typical lamp envelope applications require a material thickness of about 1 mm. At this thickness, the finished material is translucent and has a bulk thermal conductivity of about 30 W/(m·K). By comparison, thermal conductivities of the following optical materials are: glass about 1, silicone or PMMA about 0.2, and YAG about 13. Thus, thermal conductivity of PCA is approximately 150 times higher than optical polymers, 30 times higher than glasses, and 2 times higher than YAG. If glass or optical silicone were used as the cover material, the phosphor temperature would far exceed normal limits and degrade device thermal efficiency to an unacceptable degree. The RP/PCA combination allows the phosphor temperature to be lower than that of CLC.

TABLE 2

Thermal conductivities of optical materials at 25° C.

| | PCA | Glass | Optical silicone | PMMA | YAG |
|---|---|---|---|---|---|
| Thermal conductivity W/(m · K) | 30 | 1 | 0.2 | 0.2 | 13 |
| Relative thermal conductivity | 1.00 | 0.033 | 0.0067 | 0.0067 | 0.43 |

In a preferred embodiment, PCA bulbs are used as a thermally conductive yet optically translucent substrate for a remote phosphor layer. PCA's unique combination of high internal transmittance and high thermal conductivity make possible the superior steady-state efficacy of the embodiments described herein.

In order to compare steady-state performance of CLC and RP on PCA technologies, a thermal analysis is necessary to determine equilibrium LED junction and phosphor temperatures. Once the equilibrium temperatures are known, the thermal efficiency, defined as the percent efficacy or flux maintained compared to the instant-on value, can be calculated from known LED and phosphor data.

Table 3 summarizes the results from such a thermal analysis, assuming four high power (1 mm$^2$) chips in a single package; junction-to-board thermal resistance is 4 K/W, peak wavelength is ~460 nm, and drive voltage is 3.2 V for 350 mA current. In addition the Stokes efficiency used was 77%, spectrum optical efficiency 300 lm/W, electrical conversion efficiency=90%, and a board-to-ambient thermal resistance was 15 K/W.

TABLE 3

Steady-state thermal comparison of CLC and RP on PCA light engines assuming identical blue LED chips and phosphors.

| Technology | Current (mA) | Blue LED (WPE) | $T_L$ (° C.) | $T_P$ (° C.) | Thermal Efficiency |
|---|---|---|---|---|---|
| CLC | 350 | 60% | 91 | 91 | 86% |
| RP on PCA | 350 | 60% | 83 | 82 | 88% |
| CLC | 350 | 70% | 87 | 87 | 87% |
| RP on PCA | 350 | 70% | 78 | 79 | 89% |

At 350 mA, using blue LEDs with WPE≧50%, thermal efficiencies exceed 85% (thermal efficiency being defined as the percentage of flux or efficacy at 25° C. preserved at thermal equilibrium). Thermal efficiencies for CLC are about 2% lower than the RP-on-PCA values. So the reduction in component temperatures for RP on PCA leads to 2% higher thermal efficiency in all cases.

Figure 9:
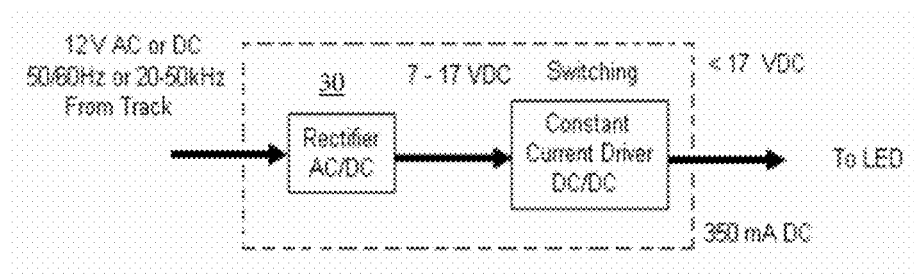
FIG. 9 is a block diagram of an embodiment of an integrated driver for the present invention.

Low voltage track light systems commonly use MR16 lamps that are 12/24VAC at 60 Hz or 20-50 kHz, or alternatively 12/24VDC. Since LEDs need a constant DC current, replacing conventional halogen lamps with retrofit LED lamps may require a replacement integrated driver 30 (see Table 4 and FIG. 9). Developments in LED technology have resulted in more efficient light source running at low power and hence requiring lower power drivers. Desirably, the integrated drivers should meet efficiencies of 90% at 6 W power level and fit to a compact form factor of the MR16, and be compatible with magnetic/electronic transformers on lighting tracks.

TABLE 4

Driver Parameters

| Parameter | Value | Units |
|---|---|---|
| Power | 6 | W |
| Driver Output Current | 350 | mA |
| Efficiency | 90 | % |
| Power Factor | >0.9 | Const |
| Lifetime | 50,000 | Hrs |

In a method of making the lamp shown, for example, in FIG. 3, one of the problems associated with the phosphor coating is the application of a uniform, reproducible coating on the ceramic, especially when the ceramic has non-planar surfaces, such as the cylindrical and hemispherical covers of the embodiments described herein. Both spray coating and slurry deposition use liquid suspensions to apply the phosphor particles to the substrate. The uniformity of the coating depends strongly on the viscosity of the suspensions, concentration of particles in suspension, and environmental factors such as ambient temperature and humidity. Coating imperfections due to flow of the suspensions before drying and day-to-day coating thickness variation are common problems.

An embodiment herein uses a pre-formed sheet that is adhered to the substrate, like wallpaper. A suspension of phosphor, surfactant, and a polymer can be prepared in an organic solvent. The suspension may then be formed into a sheet by extrusion or casting, or poured onto a flat plate made of glass and allowed to dry. The resulting phosphor/polymer/surfactant sheet may be removed or peeled from its temporary substrate and applied to the ceramic cover using a solvent or cyanoacrylate adhesive. The sheet-coated cover is baked at 900° F., burning off the polymer matrix and leaving the phosphor coating.

In a particular example, a suspension of cellulose polymer and YAG:Ce phosphor particles was formed into a sheet by extrusion. The sheet was adhered to a cylindrical substrate by wetting the substrate with isopropanol and applying pressure. The solvent softens the sheet and allows air bubbles to be squeezed out while giving adequate adhesion of the sheet to the substrate. The coated cylinder was baked in air at 900° F. to burn off the polymer, leaving a phosphor-coated cylinder. A substrate with a less complex shape may be coated by mixing the phosphor with a silicone resin that is then applied to the substrate and cured. In this instance, the silicone binder is not removed after coating. Note that a phosphor that converts blue to orange-red will be rendered unusable when heated to 900° F. in air, and in this event a different polymer with a lower burn-off temperature should be used. In some embodiments, a burn-off temperature will be in the range of 500° F. to 1000° F.

As shown in Table 5 below, the resulting lamp using embodiments described herein can function as a MR16 retrofit lamp with a projected steady state efficacy and flux of 104 lm/W and 518 lm, respectively, at a correlated color temperature of 3500 K. The luminous flux and the resulting center beam candle power (CBCP) is comparable to a 35 W halogen lamp. The LED retrofit lamp can be used in the large number of existing halogen lamp fixtures. To meet this, the power supply will convert 12 V AC typically supplied to halogen lamps to current-controlled DC suitable for LEDs. In addition, the luminaire will meet ANSI maximum dimension requirements for the MR16. Higher optical and thermal efficiencies than possible with conventional chip-level conversion are obtained using the remote phosphor on ceramic light engine technology. Direct viewing of blue LEDs is obscured and excellent mixing of the LED and phosphor-emitted light is obtained because of the ceramic translucence. The resulting diffused emission is similar in appearance to a frosted incandescent bulb and is pleasing to the eye.

TABLE 5

Specifications of MR16 replacement.

| | | | |
|---|---|---|---|
| Total Light Output (lumens) | 520 | Lamp Efficacy (lumens/Watt) | 104 |
| Energy Use in "ON" Mode (Watts) | 4.5 | Energy use on standby mode is zero (Yes/No) | YES |
| Operating Current (mA) | 350 mA | Dimmable | YES |
| CCT (K) | 3500K | Power Factor | >0.9 |
| Color Rendering Index | ≧85 R9 ≧ 50 | Chromaticity Coordinates | X = .405 Y = .390 |
| Expected Life | 50,000 hrs with 70% lumens maintenance | Beam Angle | <40° |
| Warranty | 5 years | CBCP | 1000 cd |

In addition, the combination of high optical and thermal efficiency in a compact package makes the embodiments described herein attractive for a wide variety of white LED applications. For example, the diffuse, wide angle emission from the phosphor-coated dome is particularly well suited to replacement of incandescent lamps where large beam angles are found.

While embodiments of the present invention have been described in the foregoing specification and drawings, it is to be understood that the present invention is defined by the following claims when read in light of the specification and drawings.

What is claimed is:

1. A method of making a light emitting diode (LED) lamp, comprising the steps of:
   operably mounting one or more LED chips on a base;
   covering the LED chips with an internal cover, the cover being an at least translucent ceramic whose thermal conductivity is greater than glass, an interior surface of the cover being separated from the LED chips by a gap; and
   coating an exterior surface of the cover with a phosphor, the phosphor converting light of a first wavelength range emitted by the LED chips to light of a different wavelength range, by coating the exterior surface of the cover with a suspension containing the phosphor and an organic binder and removing the organic binder by heating, leaving the phosphor on the exterior surface of the cover.

2. The method of claim 1, wherein the ceramic has a bulk thermal conductivity of at least 5 W/(m·K).

3. The method of claim 2, wherein the ceramic is polycrystalline alumina.

4. The method of claim 2, where the first wavelength range is 440-480 nm and the phosphor includes YAG:Ce so that the lamp emits white light.

5. The method of claim 1, further comprising mounting the base in a housing having an interior surface covered with a reflector that is arranged to redirect light emitted by the phosphor-coated cover and an exterior surface with heat dissipating fins.

6. The method of claim 1, further comprising covering the base under the cover with a light reflective surface.

7. The method of claim 1, wherein the coating step includes:
   forming a sheet that includes the phosphor and a polymer matrix;
   adhering the sheet to the exterior surface of the cover with an adhesive; and
   removing the polymer matrix from the sheet by heating the sheet to at least 900° F., leaving the phosphor on the exterior surface of the cover.

8. The method of claim 1, wherein the coating step includes:
   coating the exterior surface of the cover with a suspension containing the phosphor and a silicone resin; and
   curing the coated exterior surface, leaving the phosphor and silicone resin on the exterior surface of the cover.

* * * * *